US012108576B1

(12) United States Patent
Nikkhoo et al.

(10) Patent No.: US 12,108,576 B1
(45) Date of Patent: Oct. 1, 2024

(54) THERMAL INTERPOSER FOR ELECTRONIC DEVICE

(71) Applicant: Meta Platforms Technologies, LLC, Menlo Park, CA (US)

(72) Inventors: Michael Nikkhoo, Saratoga, CA (US); Brian Toleno, Cupertino, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 71 days.

(21) Appl. No.: 17/853,512

(22) Filed: Jun. 29, 2022

Related U.S. Application Data (60) Provisional application No. 63/241,957, filed on Sep. 8, 2021.

(51) Int. Cl.
| | | |
|---|---|---|
| *H05K 7/20* | (2006.01) | |
| *G04C 3/00* | (2006.01) | |
| *G06F 1/20* | (2006.01) | |
| *H05K 1/02* | (2006.01) | |

(52) U.S. Cl.
CPC ......... *H05K 7/20445* (2013.01); *G04C 3/008* (2013.01); *H05K 7/205* (2013.01); *G06F 1/203* (2013.01); *H05K 1/0204* (2013.01)

(58) Field of Classification Search
CPC .... H05K 7/2039–20518; H05K 1/0204–0206; G04C 3/008; G06F 1/203
See application file for complete search history.

(56) References Cited

U.S. PATENT DOCUMENTS

| | | | |
|---|---|---|---|
| 8,362,509 B2 * | 1/2013 | Pickard | F21V 29/83 |
| | | | 257/E33.072 |
| 9,730,309 B2 | 8/2017 | Dohn et al. | |
| 10,244,659 B2 * | 3/2019 | Jarvis | H05K 7/20481 |
| 10,664,075 B2 * | 5/2020 | Kim | G06F 3/0482 |
| 2008/0157343 A1 * | 7/2008 | Dattaguru | H01L 23/642 |
| | | | 257/703 |
| 2015/0201530 A1 * | 7/2015 | Liu | G06F 1/203 |
| | | | 362/373 |
| 2017/0054271 A1 * | 2/2017 | Müller | H01S 5/222 |
| 2020/0413569 A1 * | 12/2020 | Weng | G06F 1/20 |
| 2021/0282300 A1 * | 9/2021 | Gopalakrishna | H05K 7/1404 |
| 2022/0091484 A1 * | 3/2022 | Ali | G03B 17/55 |

OTHER PUBLICATIONS

Ceramtec, "Innovative Thermal Management With Ceramic Heat-Sinks," CeramCool heat-sinks, retrieved on Jul. 5, 2021, 3 pages.
Guedes A., et al., "Active Metal Brazing of Machinable Aluminum Nitride-Based Ceramic to Stainless Steel," Journal of Materials Engineering and Performance, May 2012, vol. 21(5), p. 671 677.

(Continued)

*Primary Examiner* — Zachary Pape
(74) *Attorney, Agent, or Firm* — Greenberg Traurig, LLP (57) ABSTRACT

A wearable device includes a housing having a cavity and a thermal interposer disposed within the cavity of the housing and thermally coupled to the housing to draw thermal energy from one or more electrical components of the wearable device and to transfer the thermal energy to the housing.

18 Claims, 7 Drawing Sheets

(56) References Cited

OTHER PUBLICATIONS

Hoong K.W., "High-performance 3D Ceramic Interposers with Aluminum Nitride using Green Chemistry Approach for Microelectronic Applications," The Hong Kong Polytechnic University, Feb. 2019, 269 pages.

Innovacera, "Boron Nitride Ceramics," Products, retrieved on Jul. 5, 2021, 7 pages, Retrieved from the Internet: URL: https://www.innovacera.com/product/boron-nitride-ceramics.

Maruwa, "Ain Multilayered Ceramic Substrates & Packages," Products, retrieved on Jul. 5, 2021, 3 pages, Retrieved from the Internet: URL: https://www.maruwa-g.com/e/products/ceramic/000101.html.

* cited by examiner

THERMAL INTERPOSER FOR ELECTRONIC DEVICE

CROSS-REFERENCE TO RELATED APPLICATION

This application claims the benefit of priority to U.S. Provisional Application No. 63/241,957, filed Sep. 8, 2021, which is incorporated by reference herein in its entirety.

BACKGROUND

Electrical components of electronic devices generate heat during operation. The amount of heat generated by components of an electronic device is generally related to a processing capability of such components as they consume electrical power and output heat while operating. As such, a temperature of the device and components thereof is often managed through various types of thermal management systems that draw heat away from components of the device and/or expel heat from the device. These thermal management systems are designed to maintain the temperature of components of the device within given operating ranges to ensure proper function of the components within the device. However, existing thermal management systems take up space, add weight, and may therefore not be well suited for use in certain electronic devices, such as wearable devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This application describes a thermal management system for managing a temperature of an electronic device. The thermal management system may include a thermal interposer disposed within a housing of the electronic device. The thermal interposer may be configured to manage a temperature of components of the electronic device by distributing heat evenly throughout the electronic device and/or transferring thermal energy from components of the electronic device to a housing of the electronic device. The housing may disperse the thermal energy to an environment surrounding the electronic device. In some examples, the thermal interposer may evenly disperse thermal energy to the housing so as to prevent hotspots from forming within and/or on an exterior surface of the housing. Such hotspots within the electronic device may cause damage and/or impede performance of the electronic device, while hotspots on the housing may cause user discomfort when the electronic device is secured to the user. Additionally, and/or alternatively, the thermal interposer described herein may unevenly direct thermal energy to the housing in order to reduce a temperature of the housing at locations where the housing contacts a user when the electronic device is secured to the user.

Furthermore, the thermal interposer may include apertures, slits, or other features formed in the thermal interposer that allow radio frequency (RF) waves (and/or other types of electrical current, signals, etc.) to pass through the thermal interposer. As such, the thermal interposer may uniformly distribute thermal energy from components of the electronic device to reduce a temperature differential of the components within the electronic device, while allowing the electronic device to communicate with other electronic devices.

In some examples, the thermal management system may be used in devices, such as, but not limited to, a wrist wearable device (e.g., a smartwatch or controller), a hand wearable device, a head-mounted device (e.g., an electronic headset device), or other wearable device. Such wrist wearable devices are referred to herein as "the wearable device" and may include smartwatches that may execute mobile applications, mobile operating system(s), output media content, provide connectivity to one or more other devices (e.g., via Wi-Fi, mobile networks, Bluetooth®, global positioning system (GPS), etc.), monitor health or fitness (and associated metrics) of a user, among other operations. The wearable device described herein may also include a display and touchscreen interface that allows users to view, create, consume, and share media content. Furthermore, the wearable device described herein may be connected to one or more other devices and may be configured to control one or more functions of the other devices based in part on user input received via the wearable device.

In some examples, the wearable includes a display structure and is secured to and/or in contact with skin (e.g., on a wrist, arm, forehead, face, etc.) of a user. The display structure may include one or more displays that are contained within or form a part of a housing of the wearable device. For example, the display(s) may include various types of displays, including, but not limited to, liquid crystal display (LCD), light-emitting diode (LED), organic light-emitting diode (OLED), micro-LED, micro-OLED, quantum-dot LED (QLED), or other types of displays. In some examples, the display structure is coupled to an attachment system that is configured to secure the wearable device to a user's wrist, arm, head, or other portion of a user's body. The attachment system may be adjustable such that the wearable device may be positioned and securely fastened to the user.

The housing of the wearable device may also house one or more other components of the wearable device. For example, the wearable device may include various types of electronic components including, but not limited to, one or more central processing units (CPU), a graphics processing units (GPU), a holographic processors, radio frequency (RF) transceivers, data dictionaries (DDIC) or other display drivers, memory, batteries or other power sources, global positioning systems (GPS), sensors, speakers, etc. The RF transceiver may be configured to receive and/or transmit RF signals associated with Wi-Fi™, Bluetooth®, 3G, 4G, LTE, 5G, or other wireless data transmission technologies. In some examples, the sensors may include one or more microphones, light sensors, near field communication (NFC) systems, buttons, touch sensors, accelerometers, gyroscopes, magnetometers, inertial sensors, heart rate sensors, oxygen sensors, temperature sensors, moisture sensors, etc.

Furthermore, the wearable device may include a printed circuit board (PCB) disposed within the housing. In some examples, one or more electrical components of the wearable device may be disposed on or coupled to the PCB. For example, the PCB may include one or more integrated circuits coupled thereto. The PCB may further include memory, processor(s), circuitry, or other electrical components coupled hereto. Additionally, and/or alternatively, one or more components of the wearable device may be coupled directly to a floor of the thermal interposer. In some examples, the PCB may include one or more vias disposed in the PCB and configured to transfer thermal energy across the PCB.

In some examples, the wearable may include a thermal interposer disposed within the housing. The thermal interposer may be coupled to the housing of the wearable device. In some examples, the thermal interposer may be coupled to the housing via an adhesive such as a thermal putty or other thermally conductive adhesive. The thermal interposer may be in direct or indirect thermal contact with one or more components of the wearable device and/or the housing of the wearable device. The thermal interposer is configured to receive thermal energy from the one or more components of the wearable device, distribute the thermal energy throughout the wearable device (e.g., uniformly distributed or directed towards specific portions of the wearable device), and transfer thermal energy toward an environment located outside of the housing.

These and other aspects are described further below with reference to the accompanying drawings and appendices. The drawings are merely example implementations and should not be construed to limit the scope of the claims. For example, while examples are illustrated in the context of a head-mounted electronic device, the techniques may be used in association with any electronic device.

Figure 1:
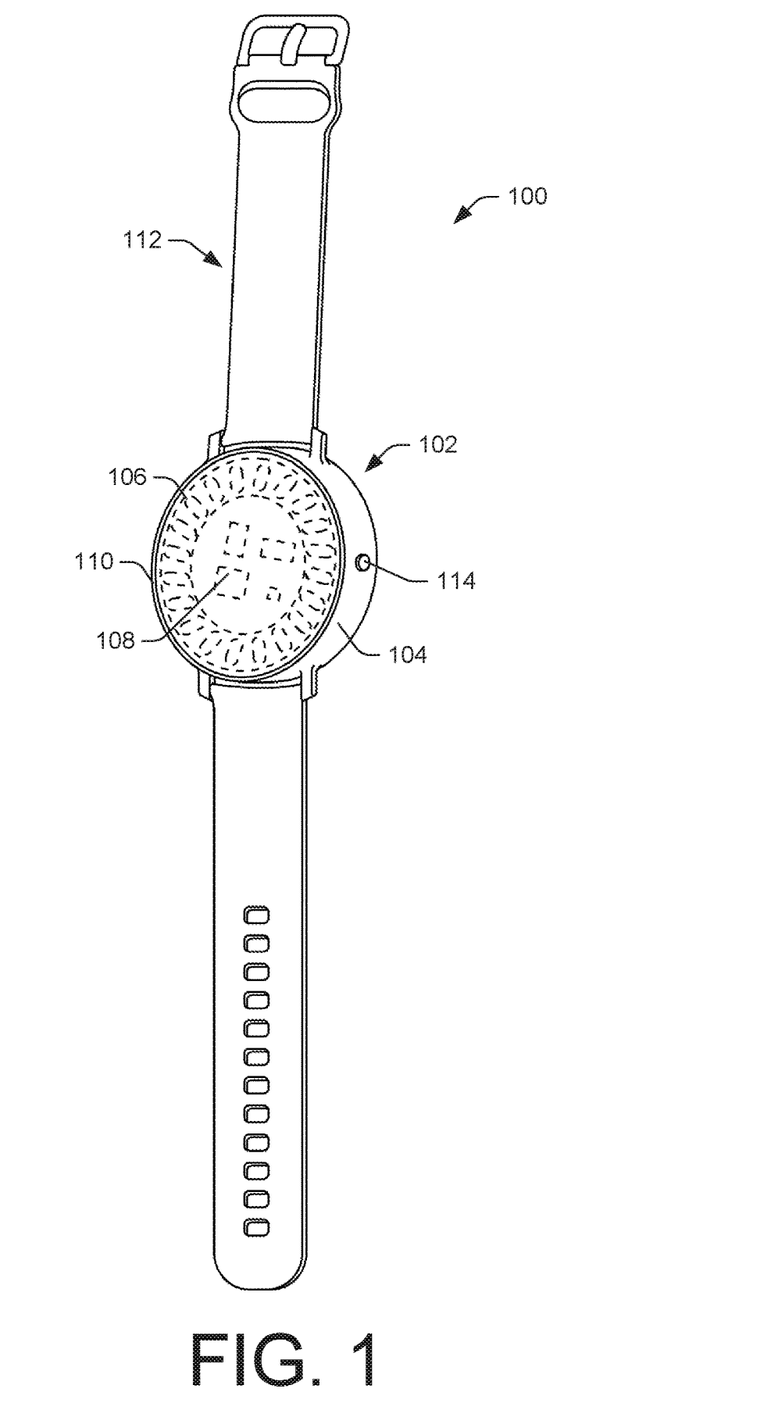
FIG. 1 illustrates a perspective view of an example wearable device in accordance with an example of the present disclosure.

FIG. 1 illustrates a perspective view of an example wearable device 100. As mentioned previously, the wearable device 100 may be a wrist wearable device, such as a smartwatch, health/fitness tracker, controller, or other type of wearable device. The wearable device 100 includes a thermal management system 102. In some examples, the thermal management system 102 is located within and includes a housing 104 of the wearable device 100.

In some examples, the thermal management system 102 includes a thermal interposer 106 disposed within the housing 104. The thermal interposer 106 may be coupled to the housing 104 of the wearable device 100. For example, the thermal interposer 106 may be coupled to the housing 104 via an adhesive such as a thermal putty or other thermally conductive adhesive. The thermal interposer 106 may be in direct or indirect thermal contact with one or more components 108 of the wearable device 100 and/or in direct or indirect thermal contact with the housing 104 of the wearable device 100. The thermal interposer 106 is configured to receive thermal energy from the one or more components 108, distribute the thermal energy throughout the wearable device 100 (e.g., uniformly distributed or directed towards specific portions of the wearable device 100), and transfer thermal energy toward an environment located outside the housing 104 via the housing 104.

In some examples, the wearable device 100 includes a display 110 coupled to the housing 104. In FIG. 1, the display 110 is depicted as being transparent in order to show the thermal interposer 106 disposed beneath the display 110. The housing 104 may include an opening in which the display 110 is at least partially inserted and is secured within the housing 104. In some examples, a shape of the housing 104 and the opening formed therein may form a cavity within the housing 104 in which the thermal interposer 106 is disposed and the display 110 may be at least partially inserted. The display 110 may be a touch sensitive display that is configured to display media (e.g., image data) and/or is configured to receive input via the display 110.

In some examples, the wearable device 100 may further include an attachment system 112 that is coupled to the housing 104 of the wearable device 100. The attachment system 112 may include an adjustable strap that secures the wearable device 100 to a user. The wearable device 100 may also include one or more selectable controls 114. The selectable control(s) 114 may be configured to receive user input via the selectable control(s) 114 to control one or more functions of the wearable device 100.

Figure 2:
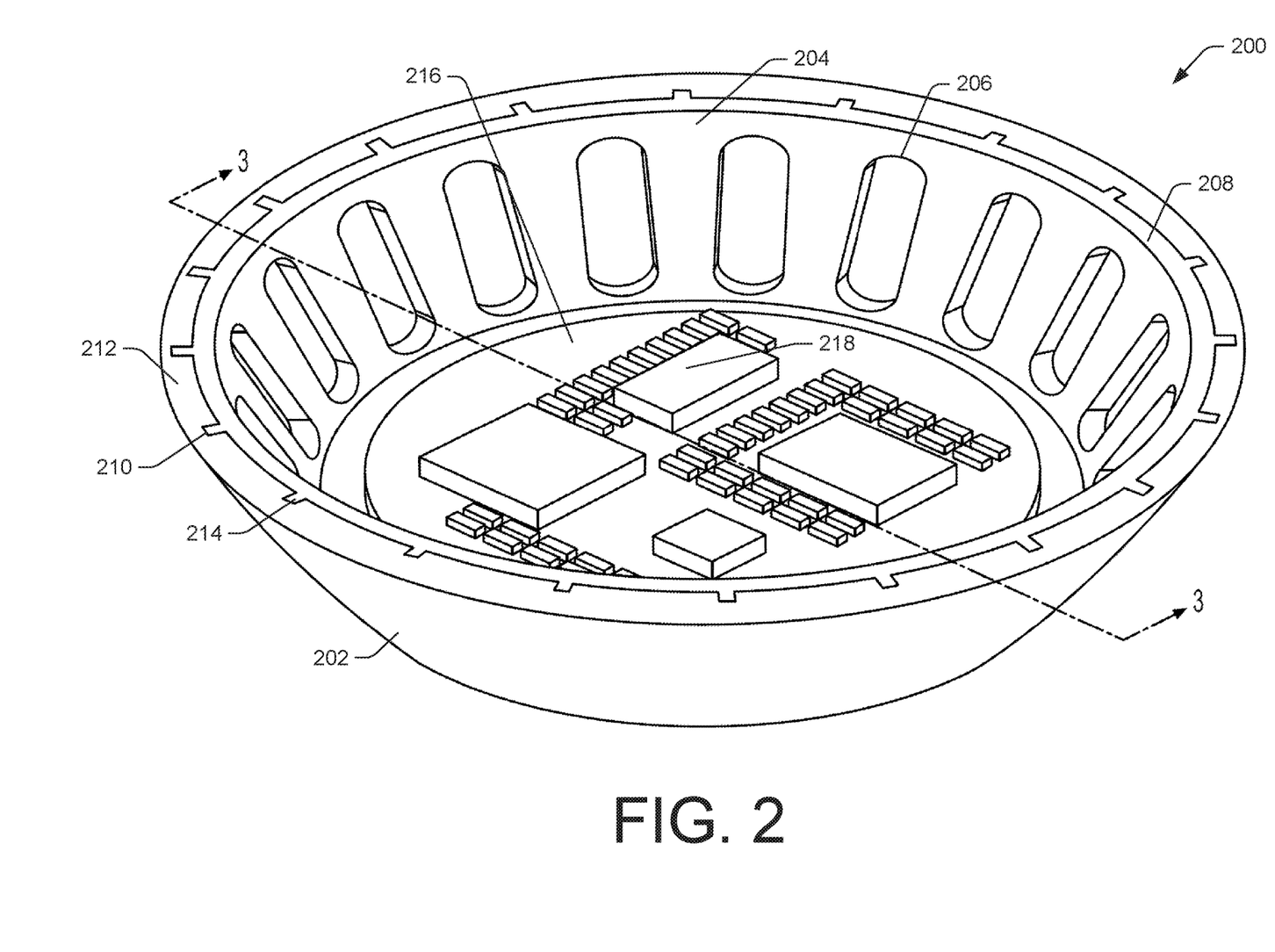
FIG. 2 illustrates a perspective view of a thermal management system in accordance with an example of the present disclosure.

FIG. 2 illustrates a perspective view of a thermal management system 200 of an example wearable device such as the wearable device 100 shown in FIG. 1. In some examples, the thermal management system 200 includes a housing 202. As mentioned previously, a display (not shown in FIG. 2) may be coupled to the housing 202 and one or more components of the wearable device may be disposed within the housing 202. In some examples, the housing 202 may comprise a metallic material such as stainless steel, aluminum, titanium, tungsten, a combination thereof, or other metallic material(s). The housing 202 may be configured to receive thermal energy from components of the wearable device and to disperse the thermal energy to an environment surrounding the wearable device.

As shown in FIG. 2, the thermal management system 200 may include a thermal interposer 204 (or "ceramic bowl") disposed within the housing 202. In some examples, the thermal interposer 204 may comprise a thin walled shell that conforms generally to a shape of an interior of a cavity of the housing 202.

In some examples, the housing 202 and the thermal interposer 204 may include any shape having a generally flat base/floor. For example, while FIG. 2 depicts the housing 202 and the thermal interposer 204 as being substantially circular, it is to be understood that the housing 202 and the thermal interposer 204 may be formed to have any shape. Such examples may include a housing 202 and thermal interposer 204 with generally rectangular or square perimeter sidewalls. Another example may include a housing 202 and thermal interposer 204 having generally cylindrical perimeter sidewalls, generally hexagonal perimeter sidewalls, generally octagonal perimeter sidewalls, etc. Furthermore, any of the above described shapes of the housing 202 and thermal interposer 204 may include sidewalls that are substantially perpendicular to a flat base, or sidewalls that are oblique or tapered relative to a flat base. In such examples, the sidewalls may include rounded edges between the sidewalls and the flat base. In some examples, the housing 202 and the thermal interposer 204 may take the form of a thin walled frustrum or "bowl shape" having a generally circular flat base with a sidewall extending at an oblique angle relative to the flat base. In such examples, the sidewalls and/or other edges of the housing 202 and the thermal interposer 204 may include rounded or non-rounded corners, chamfered, beveled, filleted, bullnosed, or other types of edge finishes.

The thermal interposer 204 may be disposed in direct or indirect thermal contact with the housing 202. In some examples, a shape of the thermal interposer 204 corresponds with a shape of the housing 202 such that the thermal interposer 204 is seated within the housing 202. The thermal interposer 204 may comprise a thermally conductive material such that the thermal interposer 204 draws thermal energy from components of the wearable device and transfers the thermal energy to the housing 202 where the thermal energy may be dispersed to the environment surrounding the wearable device.

In some examples, the thermal interposer 204 may be formed from a ceramic material such as aluminum nitride, boron nitride, aluminum oxide, or other ceramic material having a specific and/or threshold RF transparency and/or thermal conductivity. For example, the thermal interposer may be formed from a material having a thermal conductivity with a K-value (i.e., watts per meter-Kelvin (w/m-K)) between approximately 0.1 and approximately 500, between approximately 1 and approximately 400, or between approximately 10 and approximately 100. Additionally, and/or alternatively, in some examples, the thermal interposer 204 may include one or more layers of thermally conductive material such as graphite, aluminum, copper, or other material. Furthermore, the thermal interposer may be formed from a material having different K-values in different directions. For example, the material may include a first K-value in a in-plane direction through the material and a second K-value in a through-plane direction through the material where the second K-value is different than the first K-value. The first and second K-values may be within the ranges described previously.

The material used to form the thermal interposer 204 may be selected to allow radio frequency (RF) wave (or other electrical current, signals, etc.) transparency through the thermal interposer 204 in order that components located within the housing 202 may communicate (e.g., send and receive electrical current, signals, etc.) with other devices and/or components outside of the housing 202. For example, the thermal interposer 204 may be formed from a material allowing RF waves to pass therethrough in order to allow the wearable device and components thereof to communicate with external devices.

In some examples, the thermal interposer 204 includes one or more apertures 206 formed through a thickness of a sidewall 208 (or sidewalls) of the thermal interposer 204. The aperture(s) 206 may also allow RF waves (and/or other electrical current or signals) to pass through the thermal interposer 204 and may reduce and/or eliminate potential inhibition of RV waves caused by the thermal interposer 204. Additionally, and/or alternatively, the thermal interposer 204 may include slits, gaps, or other structural features formed in the sidewall 208 improving RF wave transparency of the thermal interposer 204.

It is to be understood that the thermal interposer 204 may include aperture(s) 206 having various shapes, sizes, spacings, quantities, and configurations similar to or different than the configuration shown in FIG. 2. For example, the size, shape, and position of the aperture(s) 206 are selected and/or configured to minimize interference with RF signals transmitted from and received by the wearable device 100. In some examples, the aperture(s) 206 may be formed by various shapes including circles, ovals, slots, squares, rectangles, pill-shaped, etc. In the case of ovular, pill-shaped, and/or rectangular shaped aperture(s) 206, the aperture(s) 206 may be elongated in a direction towards and/or away from a floor of the thermal interposer 204. Additionally, and/or alternatively, the aperture(s) 206 may be oriented substantially parallel to the floor and/or a top surface of the thermal interposer 204. Furthermore, the aperture(s) 206 may include open ended and not enclosed geometries. For instance, the aperture(s) 206 may be slits that are open at an upper edge of the thermal interposer 204. In some examples, the aperture(s) 206 may include a width and length between approximately 0.1 mm and approximately 5 mm, between approximately 0.2 mm and approximately 4 mm, between approximately 0.3 mm and approximately 3 mm, or between approximately 0.5 mm and approximately 2 mm. In some examples, the width and length of the aperture(s) 206 may be substantially similar or the width and length of the aperture(s) 206 may be substantially different. Alternatively, the aperture(s) 206 may be substantially circular and may include a diameter between approximately 0.1 mm and approximately 5 mm, between approximately 0.2 mm and approximately 4 mm, between approximately 0.3 mm and approximately 3 mm, or between approximately 0.5 mm and approximately 2 mm.

In some examples, the housing 202 may include one or more channel(s) 210 formed in an interior surface of a sidewall 212 (or sidewalls) of the housing 202. The thermal interposer 204 may include one or more ridges 214 extending from an exterior surface of the sidewall 208. In some examples, the ridge(s) 214 of the thermal interposer 204 are configured to correspond with the channel(s) 210 in the housing 202 such that the ridge(s) 214 are insertable into the channel(s) 210 and fit therein. The ridge(s) 214 of the thermal interposer 204 may help secure the thermal interposer 204 within the housing 202 when the ridge(s) 214 engage the channel(s) 210 of the housing 202. Furthermore, the channel(s) 210 and the ridge(s) 214 may provide increased surface area where the housing 202 contacts the thermal interposer 204 and may, therefore, increase thermal conduction between the housing 202 and the thermal interposer 204. Additionally, the ridge(s) 214 may provide additional structural support and rigidity for the thermal interposer 204, thereby providing additional structural support and rigidity to the wearable device 100. Alternatively, in some examples, the thermal interposer 204 may include one or more channels, while the housing 202 includes one or more ridges. In such examples, the ridge(s) of the housing 202 are insertable into the channel(s) of the thermal interposer 204 and fit therein.

Furthermore, in some examples, the wearable device includes a printed circuit board (PCB) 216 disposed within the housing 202. The PCB 216 may be mounted or coupled to the thermal interposer 204. In some examples, the PCB 216 may be coupled to the thermal interposer 204 via an adhesive such as a thermal putty or other thermally conductive adhesive. The PCB 216 may include one or more electrical components 218 (referred to herein as "the components") of the wearable device coupled thereto. By way of example, the one or more components may include one or more processors, memory, displays, radio frequency (RF) transceivers, cameras, speakers, microphones, sensors (e.g., accelerometers, gyroscopes, magnetometers, inertial sensors, heart rate sensors, oxygen sensors, temperature sensors, moisture sensors, etc.), batteries, or other electronic components. During operation of the wearable device, the components 218 of the wearable may generate thermal energy and the thermal interposer 204 is configured to draw thermal energy generated by the components 218 of the wearable device, to uniformly distribute the thermal energy, and to transfer the thermal energy to the housing 202 of the wearable device. In some examples, one or more of the components 218 may be coupled directly to the thermal interposer 204.

Figure 3:
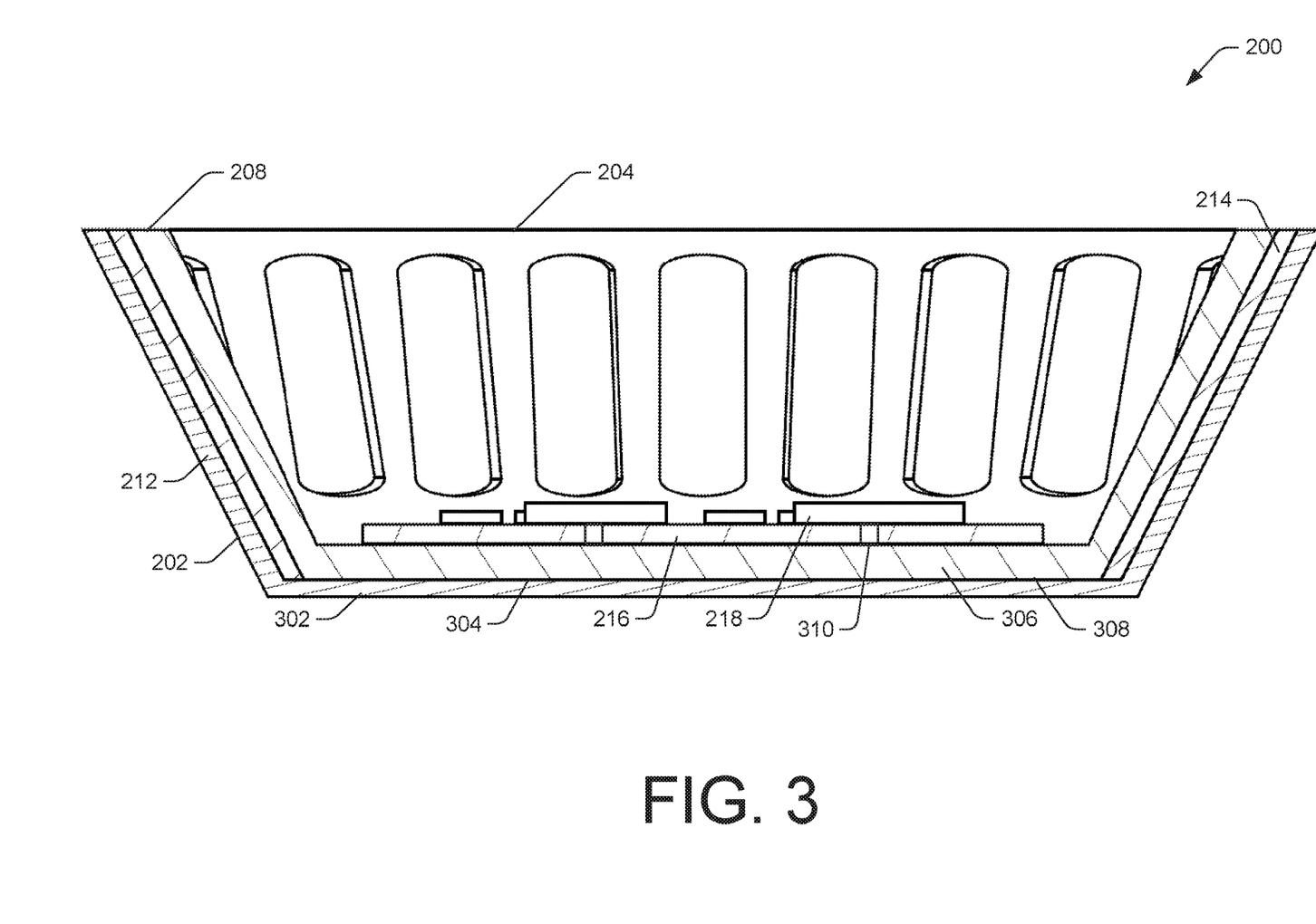
FIG. 3 illustrates a cross-sectional view of the thermal management system of FIG. 2 in accordance with an example of the present disclosure

FIG. 3 illustrates a cross-sectional view of the thermal management system 200 taken along line 3, as shown in FIG. 2. As mentioned previously, the thermal interposer 204 may be seated within the housing 202 of the wearable device. For example, the housing 202 may include a base 302 extending in a first direction. The housing 202 includes one or more sidewalls 212 extending from the base 302 in a second direction that is different than the first direction. As shown in FIGS. 2 and 3, the housing 202 may be substantially circular (or rounded) and may, therefore, include a single continuous sidewall 212. However, the housing 202 may be any shape having any number of sidewalls (e.g., a rectangular housing having four sidewalls). The base 302 and sidewall 212 of the housing 202 may form an interior surface 304 of the housing 202.

The thermal interposer 204 of the wearable device may likewise include a floor 306 extending in a direction such that the floor 306 of the thermal interposer 204 is substantially parallel to the base 302 of the housing 202. In some examples, the thermal interposer 204 includes one or more sidewalls 208 extending from the floor 306 of the thermal interposer. As shown in FIGS. 2 and 3, the thermal interposer 204 may be substantially circular (or rounded) and may, therefore, include a single continuous sidewall 208. However, the thermal interposer 204 may be any shape having any number of sidewalls and may be configured to correspond with a shape of the housing 202 that the thermal interposer 204 is seated within the housing 202. The sidewall 208, the floor 306, and/or the ridge(s) 214 of the thermal interposer may form an exterior surface 308 of the thermal interposer 204. In some examples, a shape of the exterior surface 308 of the thermal interposer 304 corresponds with a shape of the interior surface 304 of the housing 202. In some examples, the thermal interposer 204 is seated within the housing 202 such that a top surface of the thermal interposer 204 may be even with a top surface of the housing 202.

As mentioned previously, the PCB 216 includes the components 218 of the wearable device coupled thereto. The PCB 216 may include one or more vias 310 disposed through a thickness of the PCB 216. The via(s) 310 of the PCB 216 may be configured to transfer thermal energy across the PCB 216. As such, the via(s) 310 may improve thermal conductivity between the components 218 of the wearable device and the thermal interposer 204.

Figure 4:
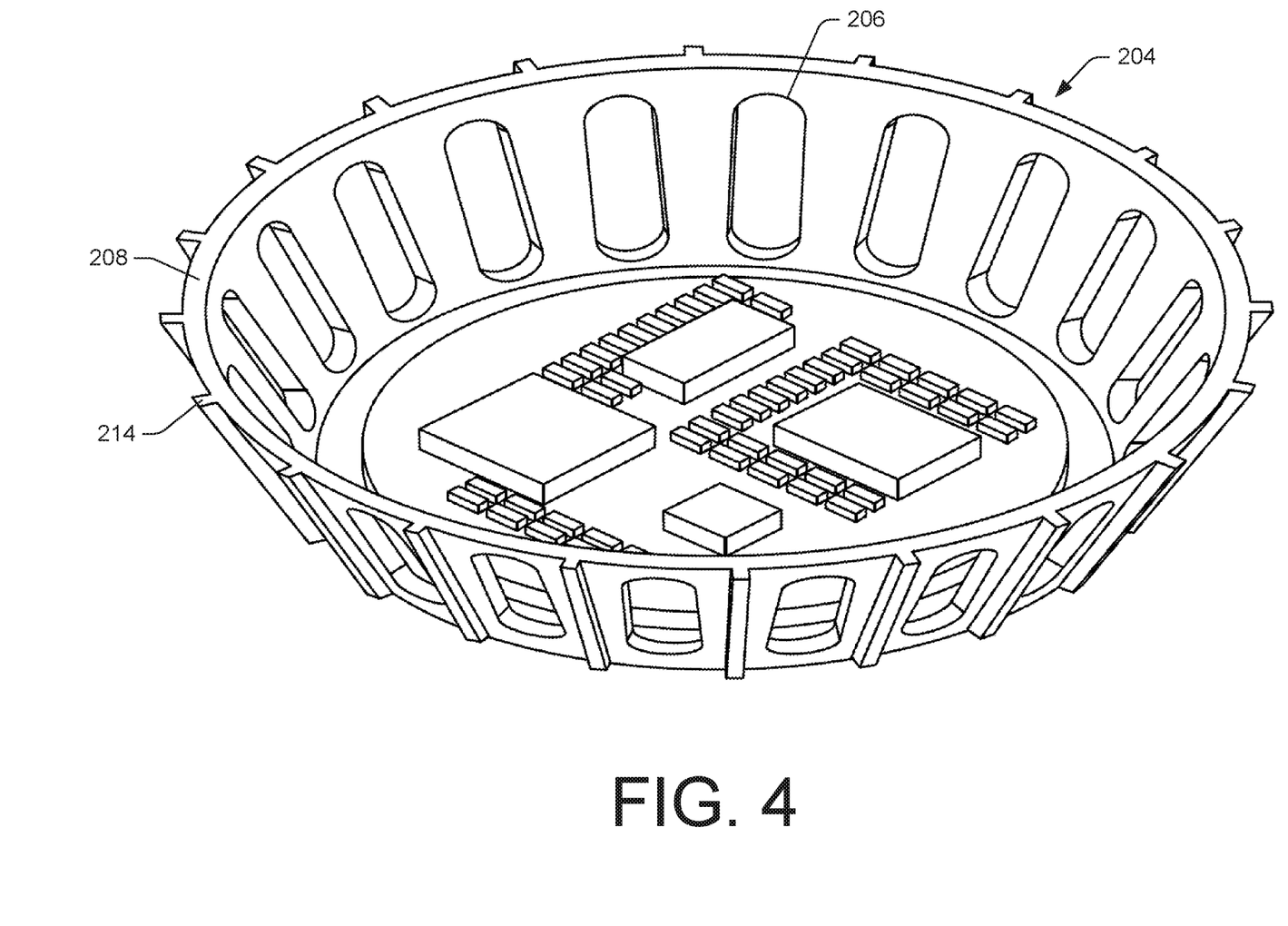
FIG. 4 illustrates a perspective view of a thermal interposer of a thermal management system in accordance with an example of the present disclosure.

FIG. 4 illustrates a perspective view of the thermal interposer 204. As mentioned previously, the thermal interposer 204 includes ridge(s) 214 extending from an exterior surface of the sidewall 208. The ridge(s) 214 may increase surface area of the thermal interposer 204, thereby increasing a surface area of contact between the thermal interposer 204 and the housing (not shown in FIG. 4). The ridge(s) 214 of the thermal interposer 204 may extend along an entire length of the sidewall 208. Alternatively, the ridge(s) 214 may include a length that is less than the length of the sidewall 208.

Figure 5:
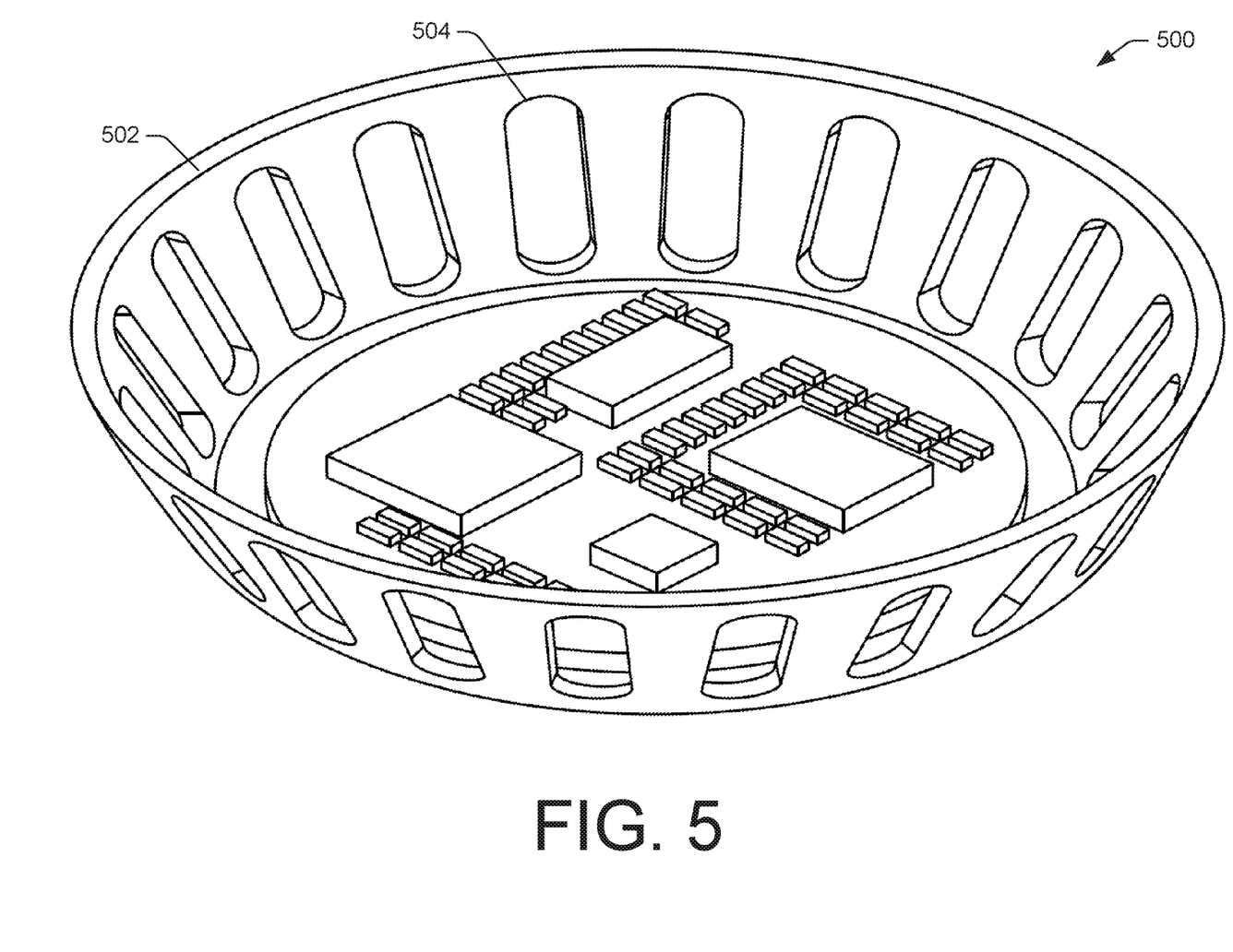
FIG. 5 illustrates a perspective view of another thermal interposer of a thermal management system in accordance with an example of the present disclosure.

FIG. 5 illustrates a perspective view of an alternative thermal interposer 500. The thermal interposer 500 shown in FIG. 5 may be substantially similar to the thermal interposer 204 shown and described in FIGS. 2-4. However, the thermal thermal interposer 500 shown in FIG. 5 may not include ridges extending from a sidewall 502 of the thermal interposer 500. Furthermore, the thermal interposer 500 may include apertures 504 formed through a thickness of the sidewall 502 and such apertures 504 may have various shapes, configuration, and/or quantities similar to or different than the configuration shown in FIG. 5. Alternatively, the apertures 504 may be omitted entirely.

Figure 6:
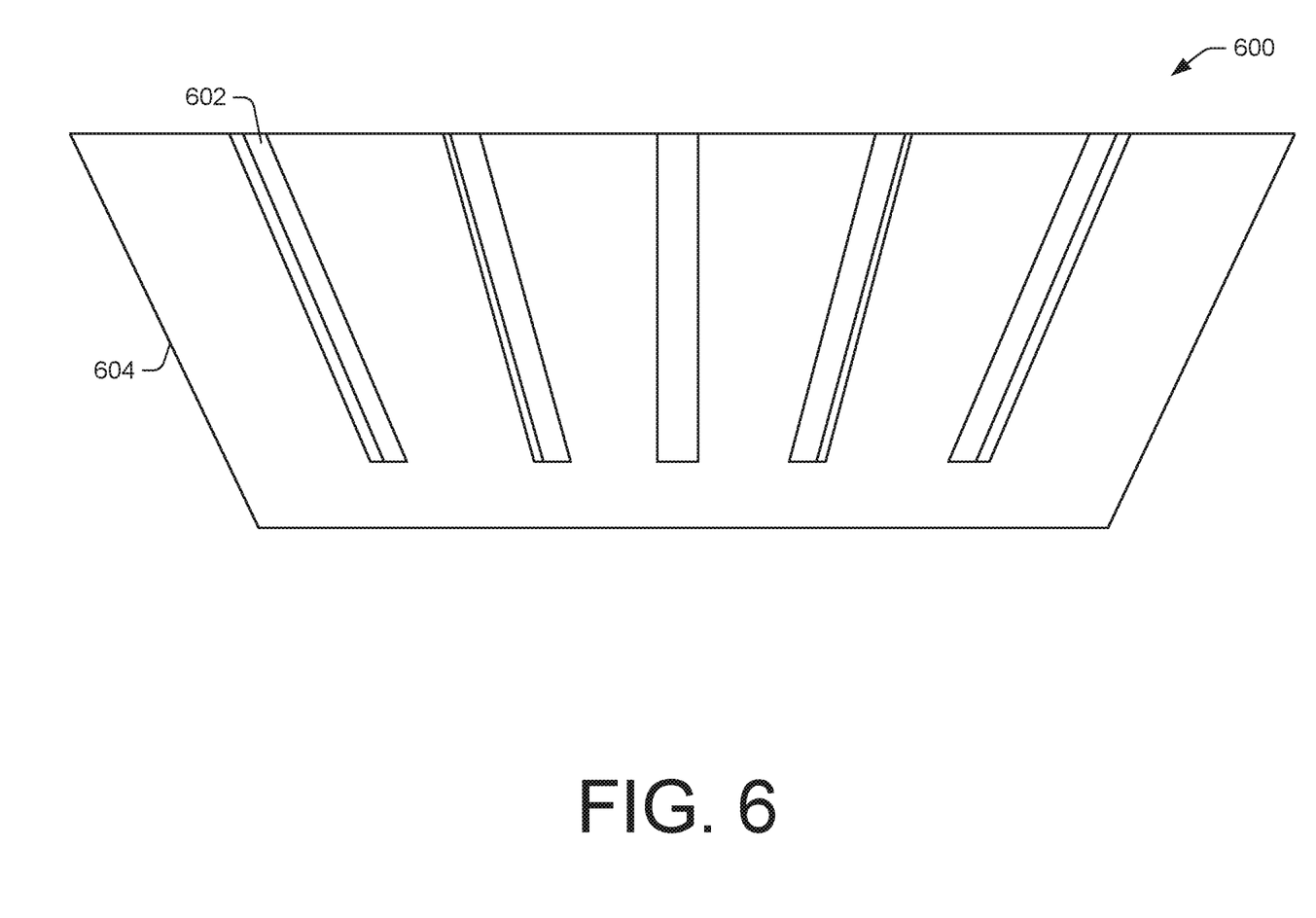
FIG. 6 illustrates a side view of another thermal interposer of a thermal management system in accordance with an example of the present disclosure.

FIG. 6 illustrates a side view of an alternative thermal interposer 600. The thermal interposer 600 shown in FIG. 6 may be substantially similar to the thermal interposer 204 shown and described in FIGS. 2-4. However, the thermal interposer 600 shown in FIG. 6 may include one or more slits 602 formed in a sidewall 604 of the thermal interposer 600. As shown in FIG. 6, the slit(s) 602 of the thermal interposer 600 may be open ended rather than enclosed. As mentioned previously, the slit(s) 602 formed in the thermal interposer 600 may be configured to minimize interference with RF signals transmitted from and received by the wearable device 100.

Figure 7:
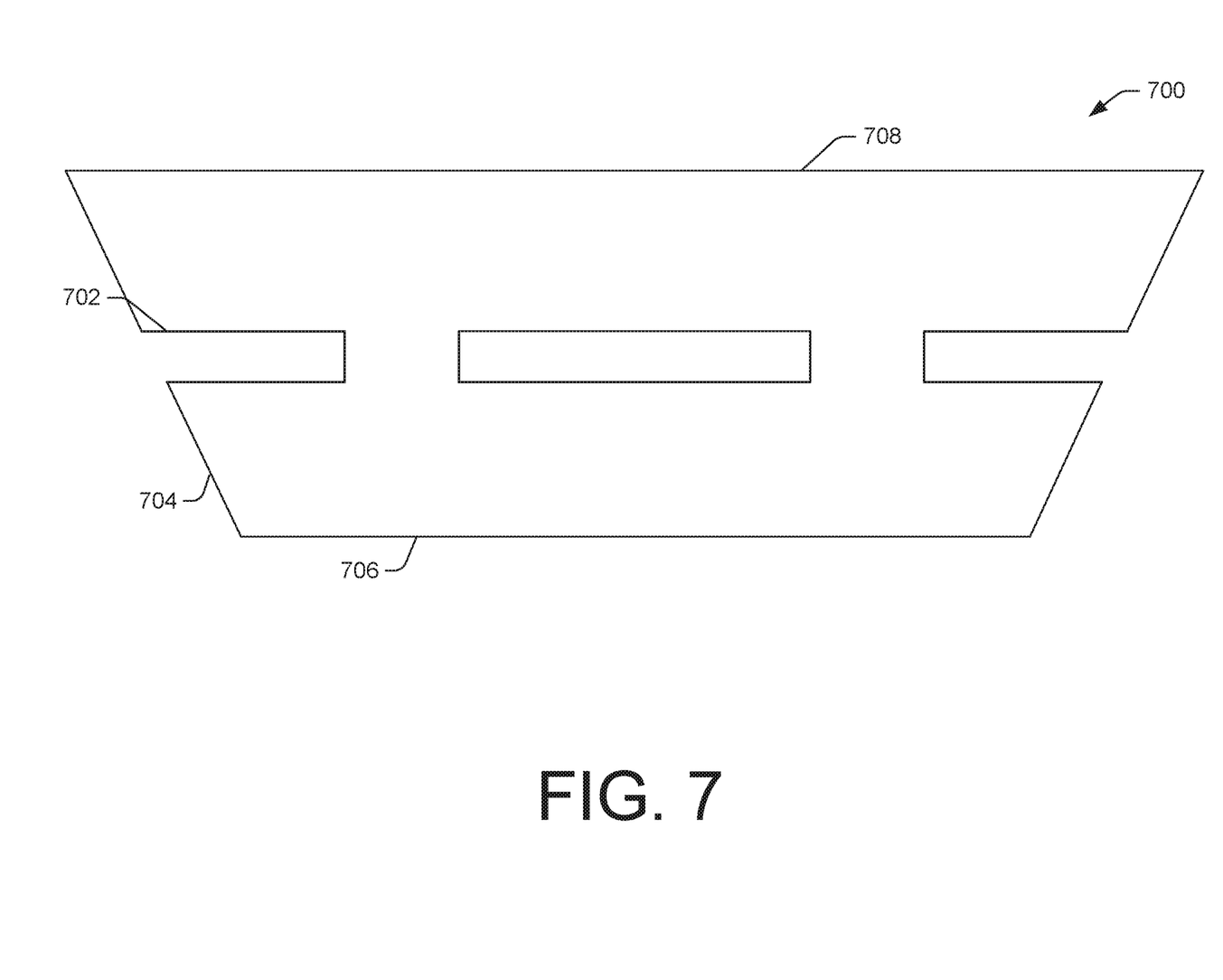
FIG. 7 illustrates a side view of another thermal interposer of a thermal management system in accordance with an example of the present disclosure.

FIG. 7 illustrates a side view of an alternative thermal interposer 700. The thermal interposer 700 shown in FIG. 7 may be substantially similar to the thermal interposer 204 shown and described in FIGS. 2-4. However, the thermal interposer 700 shown in FIG. 7 may includes one or more apertures 702 formed in a sidewall 704 of the thermal interposer 700 that are oriented substantially parallel to a floor 706 and/or a top surface 708 of the thermal interposer 700. As described previously, the aperture(s) 702 may be substantially pill-shaped, ovular, rectangular, or other elongated shape. As mentioned previously, the aperture(s) 702 formed in the thermal interposer 700 may be configured to minimize interference with RF signals transmitted from and received by the wearable device 100.

CONCLUSION

Although the discussion above sets forth example implementations of the described techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:
1. A wearable device comprising:
   a housing including a cavity;
   a thermal interposer disposed within the cavity of the housing and thermally coupled to the housing to draw thermal energy from one or more electrical components of the wearable device and to transfer the thermal energy to the housing, wherein:
   one or more interposer sidewalls of the thermal interposer include one or more apertures formed through a thickness of the one or more interposer sidewalls; and
   the one or more interposer sidewalls of the thermal interposer include one or more ridges configured to extend along an entire length of the one or more interposer sidewalls and to secure the thermal interposer within the housing; and a printed circuit board coupled to a floor of the thermal interposer, the printed circuit board having the one or more electrical components coupled thereto.

2. The wearable device of claim 1, wherein at least a portion of the thermal interposer is in direct contact with the housing.

3. The wearable device of claim 1, wherein the housing includes:

a base extending in a first direction, and one or more housing sidewalls extending from the base in a second direction that is different from the first direction, the base and the one or more housing sidewalls forming an interior surface of the cavity of the housing.

4. The wearable device of claim 3, wherein the floor of the thermal interposer extends in a second direction that is substantially parallel to the first direction, the floor and the one or more interposer sidewalls of the thermal interposer forming an exterior surface of the thermal interposer, and a shape of the exterior surface corresponding with a shape of the interior surface of the cavity of the housing.

5. The wearable device of claim 3, wherein the housing includes one or more channels formed in the one or more housing sidewalls, the one or more ridges configured to fit within the one or more channels.

6. The wearable device of claim 1, wherein thermal interposer comprises a ceramic material having a thermal conductivity of at least 20 w/m-K.

7. The wearable device of claim 1, wherein the thermal interposer comprises a shell that conforms to a shape of an interior of the cavity of the housing.

8. The wearable device of claim 1, wherein the cavity of the housing includes an opening, the wearable device further comprising a display disposed in the opening of the cavity and coupled to the housing.

9. An electronic watch comprising:

a housing having a base and a first sidewall extending from the base forming an interior surface of the housing;

a thermal interposer having a floor and a second sidewall extending from the floor such that the floor and the second sidewall are shaped to be seated within the housing, the thermal interposer being configured to draw thermal energy from one or more electrical components and to transfer the thermal energy to the housing, wherein:

one or more interposer sidewalls of the thermal interposer include one or more apertures formed through a thickness of the one or more interposer sidewalls; and the one or more interposer sidewalls of the thermal interposer include one or more ridges configured to secure the thermal interposer within the housing and to extend along an entire length of the one or more interposer sidewalls; and a printed circuit board disposed on the floor of the thermal interposer, the printed circuit board having the one or more electrical components mounted thereon.

10. The electronic watch of claim 1, wherein the thermal interposer comprises aluminum nitride, boron nitride, or aluminum oxide.

11. The electronic watch of claim 9, wherein the thermal interposer is coupled to the housing via a thermally conductive adhesive.

12. The electronic watch of claim 9, wherein the first sidewall of the housing includes one or more channels formed therein, and the one or more ridges are configured to be insertable into the one or more channels of the first sidewall.

13. The electronic watch of claim 9, further comprising a display coupled to the housing.

14. A thermal interposer comprising:

a ceramic bowl disposed within a housing of a wearable device and thermally coupled to the housing, such that the ceramic bowl is seated within the housing and the ceramic bowl is configured to draw thermal energy from an electrical component of the wearable device and to transfer the thermal energy to the housing, wherein:

one or more interposer sidewalls of the ceramic bowl include one or more apertures formed through a thickness of the one or more interposer sidewalls; and the one or more interposer sidewalls of the thermal interposer include one or more ridges configured to extend along an entire length of the one or more interposer sidewalls.

15. The thermal interposer of claim 14, further comprising a printed circuit board coupled to a floor of the ceramic bowl, the printed circuit board having the electrical component coupled thereto.

16. The thermal interposer of claim 15, wherein the one or more interposer sidewalls extend from the floor of the ceramic bowl.

17. The thermal interposer of claim 16, wherein the one or more apertures comprise pill-shaped apertures that extend toward or away from the floor of the ceramic bowl.

18. The thermal interposer of claim 14, wherein the the one or more ridges are configured to fit within one or more channels of the housing.

* * * * *